United States Patent [19]

Cisco et al.

[11] Patent Number: 4,739,247
[45] Date of Patent: Apr. 19, 1988

[54] BIDIRECTIONAL RF SWITCH MATRIX MODULE APPARATUS

[75] Inventors: Michael H. Cisco, Richardson; Neil E. Gower, Plano; Edgar L. Caples, Richardson, all of Tex.

[73] Assignee: Rockwell International Corporation, El Segundo, Calif.

[21] Appl. No.: 64,953

[22] Filed: Jun. 22, 1987

[51] Int. Cl.$^4$ ............................................. G05B 24/02
[52] U.S. Cl. ................................... 323/354; 333/81 R
[58] Field of Search .................... 323/352, 353, 354; 333/24 R, 81 R

[56] References Cited

U.S. PATENT DOCUMENTS 3,646,484  2/1972  Maxwell et al. ................... 333/81 R
4,216,444  8/1980  Vergnolle et al. ................. 333/81 R
4,654,610  3/1987  Dasilva .............................. 323/354

Primary Examiner—Patrick R. Salce
Assistant Examiner—Anita M. Ault
Attorney, Agent, or Firm—Bruce C. Lutz; V. L. Sewell; H. Fredrick Hamann

[57] ABSTRACT

A controllable switch matrix module is disclosed for bidirectional transmission of signals between multiple ports in a single module, where the attenuation characteristics are dynamically alterable. The invention uses pin diodes both for isolation and for switching, and achieves its high isolation in part by completely enclosing each of the attenuation functions within separate compartments, enclosing the connections between compartments for isolation between functions, and supplying control signals to the pin diodes using feedthrough connections designed in such a way as to prevent the emission of RF signals via the feedthrough devices. Only two bits are required to define any one of four attenuation levels between any two ports.

7 Claims, 4 Drawing Sheets

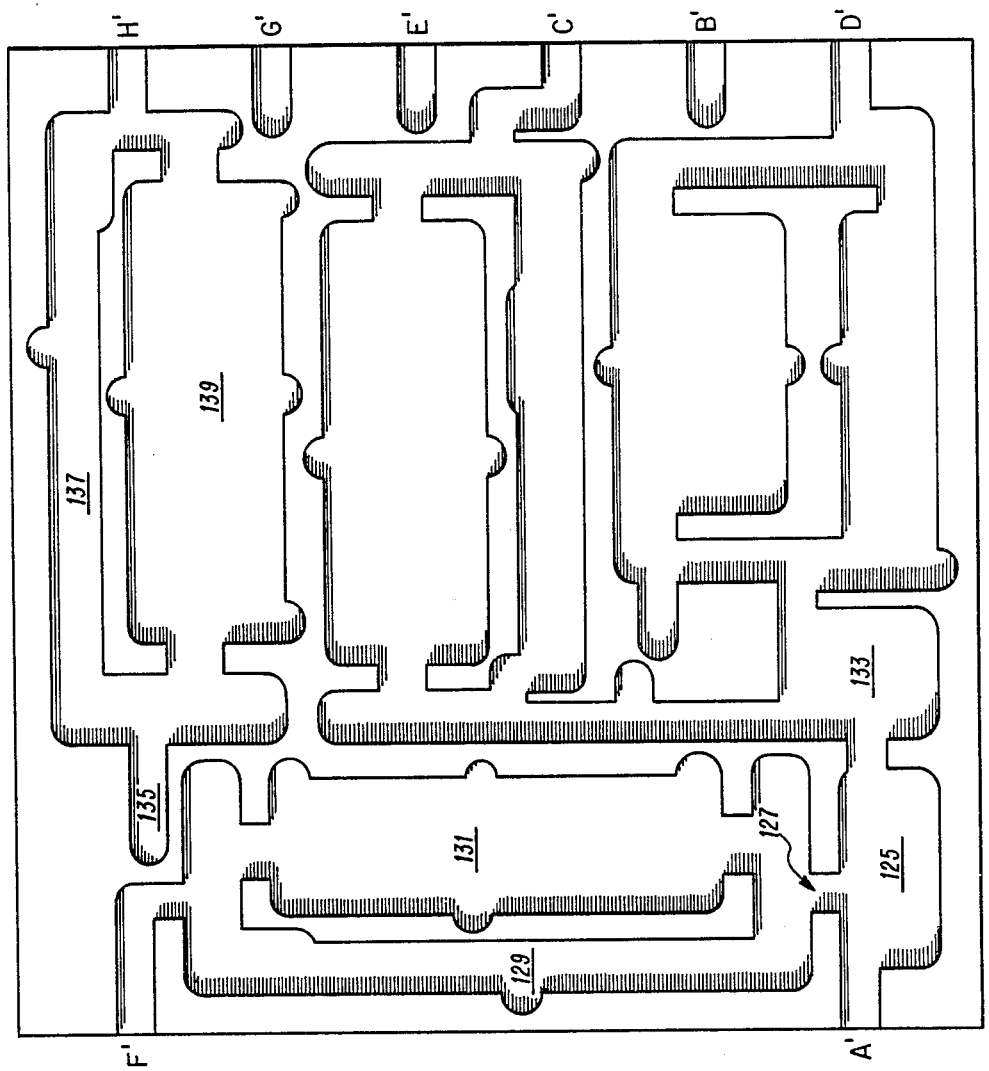

4,739,247

BIDIRECTIONAL RF SWITCH MATRIX MODULE APPARATUS

THE INVENTION

This invention was made with Government support under Contract No. MDA-903-85-C-0205 awarded by the Defense Advanced Research Projects Agency. The Government has certain rights in this invention.

The present invention is generally concerned with electronics and more specifically is concerned with RF signal switching and attenuation of the signals with the switching and attenuation apparatus being bidirectional. Even more specifically, the present invention is concerned with an all purpose RF switch module usable in a range of 150 MHz to 2.9 GHz with bidirectional paths which may be closed, open or switchable with various attenuation levels as large as 60 dB, where port to port isolation is greater than 130 dB.

BACKGROUND

The present invention was developed in conjunction with an effort to provide a Cartesian grid to interconnect adjacent transceivers in a laboratory test environment as directed from a programmable computer control console. In view of the frequencies involved and the isolation required between ports, there was no known way of accomplishing such an interconnection even with manual switching. The added requirement of dynamic computer controlled switching of signals between ports and the requirement that the signal transmission be bidirectional merely added to the complication. One embodiment of the present inventive concept comprises an eight port device using high isolation, low insertion loss resistive dividers, absorptive switches, and attenuators. The interconnection between four of the ports is uncontrolled, while there is interconnect control circuitry associated with the remaining four ports. The design of the RF switch matrix is such that switched interconnect paths between any two of the eight ports are possible provided that at least one of the two ports has the interconnect control circuitry. Any port may be connected to any other port with return loss virtually independent of the path selected. Each switch path may be actuated independently or simultaneously.

It is thus an object of the present invention to provide a multipurpose device, which can accomplish a plurality of signal switching and attenuation functions, all operating with high frequencies, and maintaining a large amount of signal isolation between ports as appropriate.

Other objects and advantages of the present invention will be apparent from a reading of the specification and appended claims in conjunction with the drawings wherein:

FIG. 3 is a chart indicating the binary value or logic level of the switching signals for each of various conditions of attenuation of the attenuator of FIG. 2;

FIG. 4 is a plan view of the enclosed cavity portion of the present device for accomplishing dividing and attenuation of the signals while maintaining the indicated isolation.

DETAILED DESCRIPTION

Figure 1:
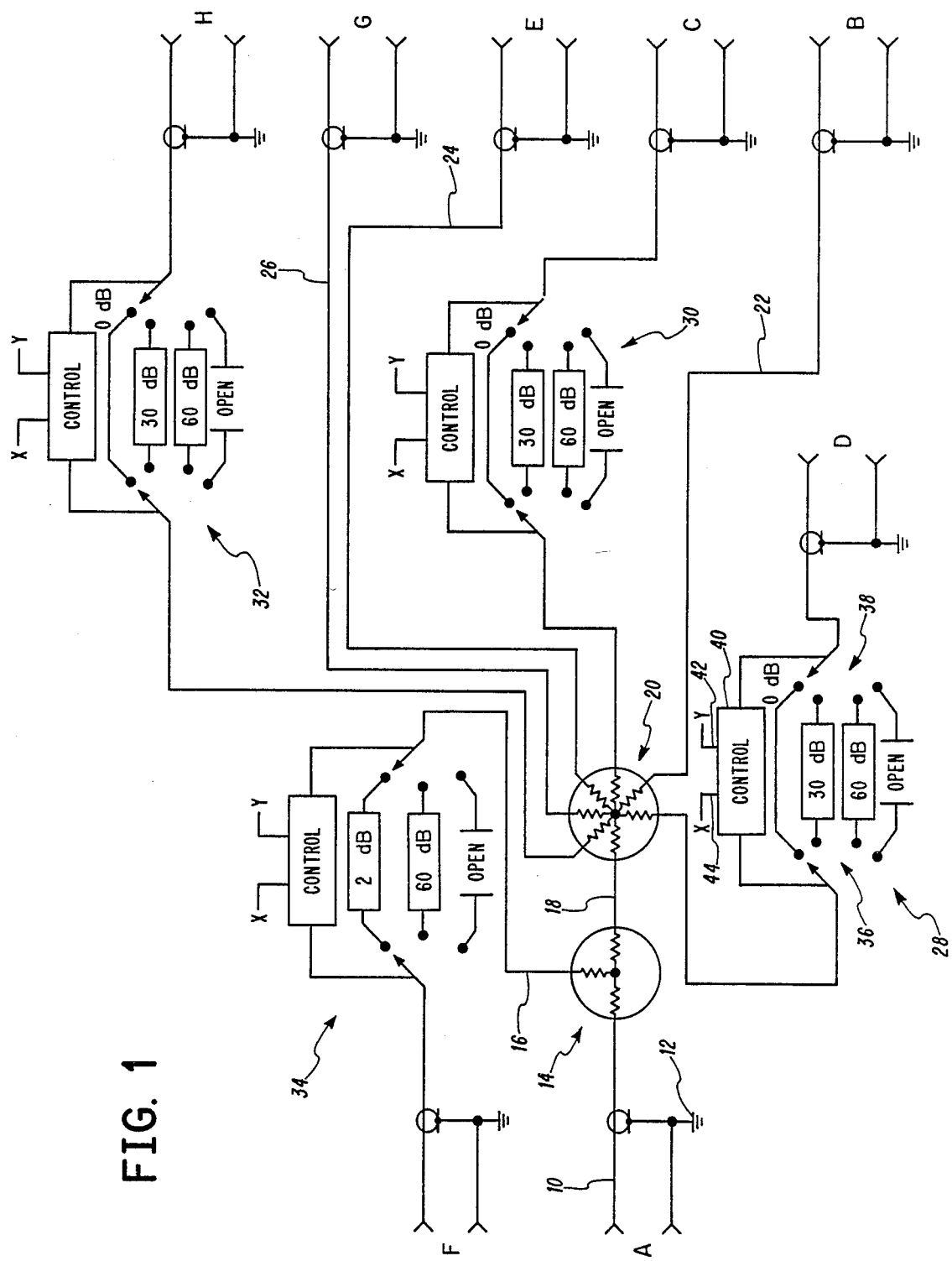
FIG. 1 is a block schematic diagram of the overall module.

In FIG. 1, an RF signal port 10 is shown and is also labeled PORT A. PORT A is connected by a signal transmission means having a grounded case connected to ground 12 and supplying signals to a first signal divider 14. This divider has a 6 dB signal loss. It has a first output 16 and a second output 18. Lead 18 is connected to a second bidirectional signal divider 20 which has outputs connected directly to an output port B on lead 22, an output port E on lead 24, and an output port G on lead 26. An attenuator section generally designated as 28 connects a further lead of divider 20 to a port D. Further attenuators, generally designated as 30, 32, and 34 connect the remaining leads of divider 20 to ports C, H and F, respectively. Each of attenuators 28, 30, and 32 is constructed identically and each have 0, 30, and 60 dB attenuation conditions and an "open" condition to proving greater than 130 dB isolation port-to-port condition. In attenuator 28, a pair of multiple position switches designated as 36 and 38 receive control signals from a control block 40 which receives a pair of binary input signals on leads 42 and 44 as X and Y binary signals. The control signals from control 40 select the attenuation condition for signals passing through attenuator 28. Although the switches designated as 36 and 38 are represented as mechanical for ease of illustration, an actual implementation uses pin diodes to perform the switching function. The attenuator, designated as 34, is constructed similarly, except that there are only three modes of operation, and comprise 2 and 60 dB modes of attenuation and an open mode.

Figure 2:
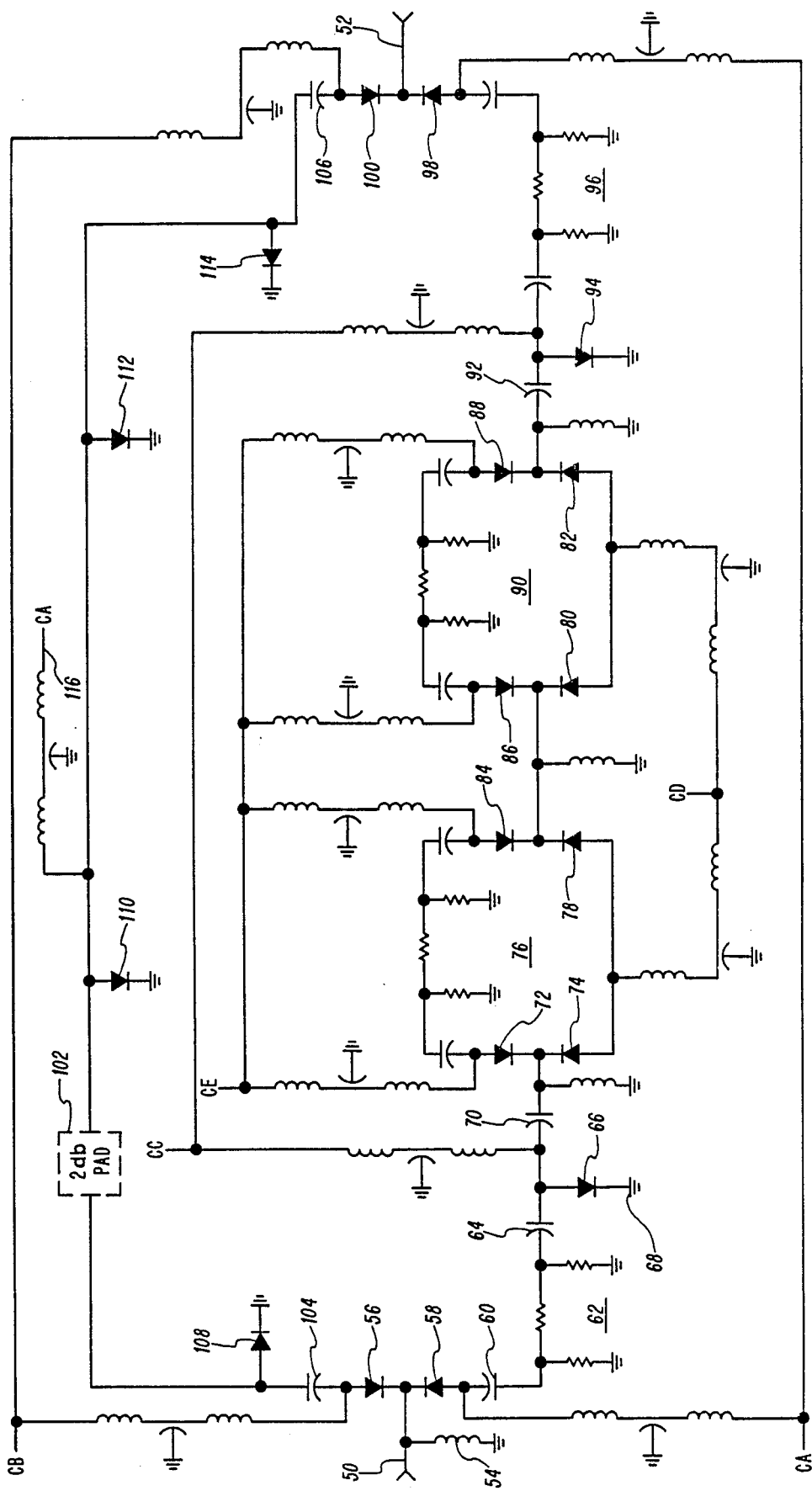
FIG. 2 is a schematic diagram of an attenuation-switch portion of FIG. 1.

In FIG. 2, a circuit diagram is shown illustrating the attenuators of FIG. 1 and using attenuator 28 as an example, basically illustrate the switches 36 and 38 in conjunction with the various attenuation stages. Direct voltage logic level signals are applied to various terminals labeled as CA, CB, CC, CD, and CE. The terminal CA appears twice as these signals are identical, but are passed through the circuit board in two different places physically on the actual device. Signals are bidirectionally input to the attenuator at either end via leads 50 or 52. Lead 50 is connected to an inductance 54 and to pin diodes 56 and 58. Diode 58 is connected through a capacitor 60 to a 15 dB attenuation pad, generally designated as 62, and from there through a capacitor 64 and some undesignated inductances to logic input CC. A pin diode 66 is connected between capacitor 64 and ground 68. Logic input CC is also connected via a capacitor 70 to a further pair of pin diodes 72 ano 74. The other end of pin diode 72 is connected to binary logic control CE, and also through a capacitor to a 15 dB attenuation device, generally designated as 76. The other end of diode 74 is connected to a further pin diode 78, and also connected to a logic level input CD. Logic level input CD is further connected to pin diodes 8C and 82. An input CE is also connected to further pin diodes, such as 84, 86, and 88. A third 15 dB attenuation pad, generally designated as 90, is connected between anode ends of the pin diodes 86 and 88, as shown. A junction between pin diodes 82 and 88 is connected via a capacitor 92 to a pin diode 94 and to the previously mentioned binary control input CC. A signal path is also found between this junction point and a fourth 15 dB attenuation pad, generally designated as 96. A pin diode 98 is connected between input lead 52 and the pad 96 and is controlled by the logic input CA. A pin diode 100 is also connected to lead 52 and is controlled by signals from the control input CB. A dash line block designated as 102 is connected via a capacitor 104 to pin diode 56 and via a capacitor 106 to pin diode 100. The signal path making this connection has a plurality of pin diodes 108, 110, 112 and 114 situated at quarter wavelength intervals along this signal path, and these diodes 108 through 114 provide signal isolation when activated by a logic level signal appearing on binary logic input CA, also designated as 116 in the drawing.

FIG. 3 illustrates the logic levels of the DC signals appearing at the various binary terminals CA through CE for various conditions of signal attenuation between terminals 50 and 52. The indicated values will be discussed further in the operation.

In FIG. 4, the drawing illustrates the relative size of the compartments holding the various RF circuitry components, and the connecting conduits between compartments. In one embodiment of the invention, these compartments were machined into a solid block of metal. A printed circuit having rf circuitry was then attached to the base of the compartments. As illustrated, a compartment 125 containing the three way splitter, shown as 14 in FIG. 1, is connected via a short path or conduit to port A'. It is also connected via a path designated as 127 to a set of areas 129 and 131. The area 129 contains the 2 dB attenuator of attenuator means 34 in FIG. 1, whereas the larger area contains the 60 dB attenuator portion of attenuator 34 of FIG. 1. It will be noted that none of the connection openings between compartments line up in a straight line. This non-alignment provides a further means to reduce coupling of RF signals between compartments and between ports such as A' and F'. The compartment 125 is also connected via a short passageway to a compartment 133 containing the six way splitter 20 of FIG. 1. Two of the outputs to the attenuators of D and C are shown with the remaining connections to the various supports being made on the other side of the metal base used to enclose the chambers. These paths are made on a further printed circuit board attached to the other surface of this base. Such a path is also used to connect to the left hand side of the attenuator 32 which is connected to port H. In other words, there is a connection on the other side of the base from compartment 133 to an area designated as 135 which then connects to two compartments designated as 137 and 139 for housing the 0 dB and the 30 and 60 dB portions of attenuator 32, respectively. It is believed unnecessary to further comment on the remaining compartments of the base or their construction, since the design approach will be obvious to those skilled in the art.

Figure 5:
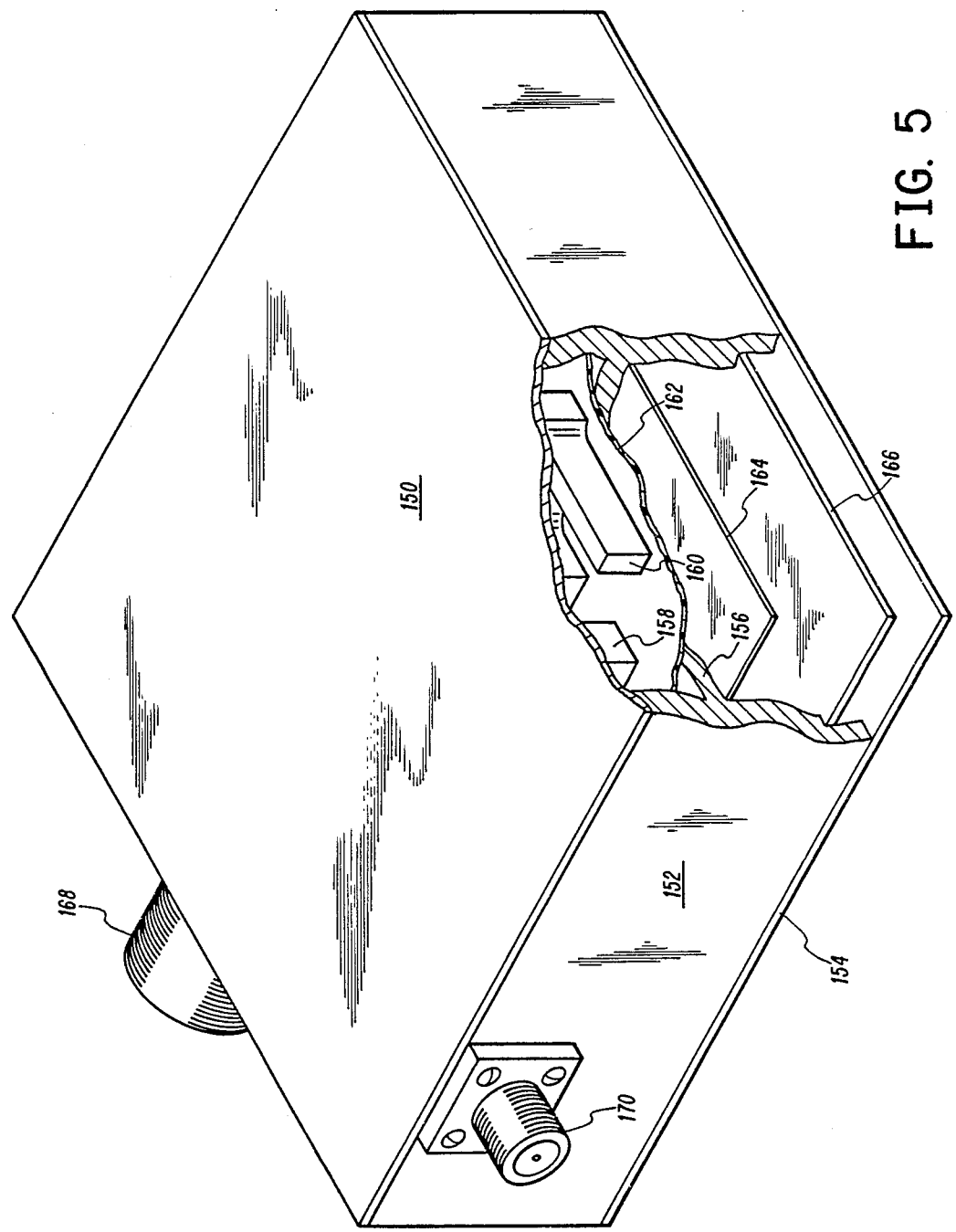
FIG. 5 is a cutaway isometric drawing of the module illustrating the relative depth of the compartments and the placement of other circuitry to form an enclosed and RF signal contained device.

The design approach of FIG. 4 is additionally illustrated by an isometric drawing of the module with a breakaway at the corner of port A, wherein a cover 150 is shown enclosing a top portion of a box having a side 52, and a further cover on the opposite side designated as 154. Within the box are cutout portions, such as shown in FIG. 4. The material of sides 152 extends horizontally to form a floor designated as 156 having walls such as 158 and 160 used in defining the various compartments in the RF section. Such a set of compartments may be obtained by machining a large block of metal to the desired shape. On each side of the floor 156 is a printed circuit board, one of which is designated 162 and the other is 164. The board 162 is on the base of the compartments shown in FIG. 4, and contains a majority of the RF circuitry, including all the circuitry shown in FIG. 2. A further printed circuit board 166 contains the control circuitry for converting the various lead pairs of binary input signals to the appropriate values to control the leads CA through CE for each of the various attenuators. These leads are brought in via an electrical connector (not shown in FIG. 4) designated as 168 in FIG. 5. The RF terminal or port F is shown as a projection 170 on the box. As will be ascertained, the floor 156, the walls such as 158 and 160, and the cover 150, define enclosed chambers and conduits for both directing and confining the RF signals and preventing the transmission of these signals to the environment, or to the area containing the control circuitry on board 166. If such RF signals escaped from the main cavities into the control area, they could then travel along the control leads to other compartments of the RF compartmentalized space and defeat the high signal strength isolation obtained by the present design.

OPERATION

As shown in FIG. 1, the bidirectional switched module comprises two-way (14) and six-way (20) resistive power dividers thereby providing switched bidirectional connectivity between the eight ports designated as A through H. Three of the bidirectional paths through the ports A, E, B, and G maintain signal attenuations within 1 dB of theoretical loss. Three other bidirectional paths through ports A, C, D, and H can function as closed, open, or switchable in attenuation between 30 and 60 dB. The last bidirectional path between ports A and F can function as open or switchable between 2 and 60 dB attenuators. These attenuation values can be easily factory selected for various applications and requirements simply by changing the resistive components. The range of attenuator switching within a given designed module can be increased by adding more binary control lines and pin diode switches.

The design of the circuitry, as well as the compartmentalization of the RF paths in the module providing shielding continuity, allow these functions to be condensed into a small, single module affording high open circuit isolation with negligible internal cross talk. One embodiment of the present invention provided an input/output port-to-port isolation of greater than 130 dB. Thus, the present module provides a universal attenuation device for many applications, as well as providing an interconnect for a Cartesian grid of transceivers for testing purposes, as was its original design.

While a substantial amount of isolation between ports has been previously accomplished between ports using unidirectional reflective attenuators and signal dividers, even these prior art (non-bidirectional) devices did not approach the isolation provided with the present concept. Moreover, power dividers/attenuators having bidirectional signal paths with the referenced isolation have not even been previously pursued to the best of the Applicant's knowledge.

The operation of the block diagram of FIG. 1 is believed reasonably straightforward in that, if transceivers are connected to ports A and H, a signal from the transceiver connected to port A is divided in divider 14 with a 6 dB loss and then divided again in the divider 20 with a further 16 dB loss. This signal is then passed through the attenuator 32, with anywhere from 0 to 60 dB loss depending upon the settings of the control block, and eventually passed to port H. Return signals are passed through exactly the same path with the same loss, and thus simulate an environmental condition of given losses between transceivers when they are actually physically situated very close to each other. Port F is connected to port A with only a single signal divider therebetween. There is less attenuation between port A and port F, even when attenuator 34 is in the 2 dB attenuation mode, than would occur between port A and a port such as B which does not have an attenuator in view of the 16 dB loss within six-way divider 20.

In the design of the attenuator of FIG. 2, the diodes 108, 110, 112, and 114 provide signal isolation between terminals 50 and 52, as these diodes are situated at one-quarter wavelength intervals and act as signal traps. Thus, when the attenuator is receiving control signals to set the attenuator to an open condition, a logic 0 will appear on line CB to maintain series pin diodes 56 and 100 in an "off" condition, and a logic 1 will appear on line CA to activate each of the pin diodes 108 through 114. The diodes 56 and 100 each provide more than 40 dB of isolation, and the traps provided by the remaining diodes further decrease the amount of signal which can pass from terminal 50 to 52. As shown in the lower portion of FIG. 2, a logic 1 appearing on lead CA will allow the diodes 58 and 98 to be activated, but there is still series isolation by a logic 0 being applied to control terminal CD to keep diodes 74 through 82 in an "off" condition as well as diodes 72, 84, 86, and 88 due to the logic 0 on control lead CE. The control signal CC provides a logic 1 to diodes 66 and 94, which again operate in a signal trapping fashion similar to that of diodes 108 through 114 in the upper portion. The logic levels for the open circuit condition are shown in FIG. 3. The values of the various control leads for each of the other conditions are also shown in FIG. 3, and the same technique can be used to ascertain the operation of this circuit from the table of FIG. 3. The pad shown as 102 is shown in a dash line form, since this only appears in the attenuator 34 of FIG. 1 and the pad would be replaced by a solid conductor for the 0 dB attenuation path of each of the remaining attenuators of FIG. 1.

While the present invention was designed as a interconnect for testing transceivers in a laboratory, it will find use in many other applications where a universal, signal bidirectional, and controllable attenuator is desired. The design of the unit, using completely enclosed compartments with offset connection conduits, enables a large degree of signal isolation in combination with the pin diodes used, both in series with the signal paths and connected to ground at quarter wavelength intervals for signal traps.

Although we have shown a preferred embodiment of this invention, we wish to be limited not by the embodiment illustrated, but only by the scope of the appended claims, where we claim:

1. Multipurpose RF switch apparatus for selectively interconnecting ports thereof comprising, in combination:
   first ports means for bidirectionally passing signals;
   second, third, fourth, fifth, sixth, seventh and eighth ports means for providing bidirectional signal passing capability with said first means;
   signal splitting ninth means directly connecting said first port means with said second, third and fourth port means and providing further outputs for communication with said remaining port means;
   controllable multipath switched means, including control input means, connecting said further outputs of said signal splitting means to said fifth, sixth, seventh and eighth remaining port means, said multipath switched means including exclusively selectable open, shorted and attenuated paths between said ninth means and said remaining port means; and
   control signal supply means, connected to said control input means of said switched means, for supplying input signals thereto whereby the attenuation of signals between ports of the switch apparatus is dynamically setable to predetermined conditions.

2. Multipurpose controllable signal switch apparatus comprising, in combination:
   port first, second and third means for bidirectionally transferring signal information;
   signal dividing fourth means, connected between said first and second port means and including further output means, for adjusting signal amplitudes between ports;
   controllable switch fifth means, connected between said third means and said further output means of said fourth means and including control input means, for adjusting attenuation therethrough, in response to control input signals, between maximum and minimum signal blocking conditions; and
   signal supplying sixth means for supplying control signals to said control input means of said fifth means.

3. Bidirectional adjustable attenuator apparatus comprising, in combination:
   ground potential first means for providing a reference potential;
   signal input second and third means for supplying and receiving signals relative said ground potential first means;
   pin diode fourth means connected in series between said second and third means;
   a plurality of diode fifth means connected between said second and third means at one-fourth wavelength intervals for providing signal isolation; and
   control signal sixth means, connected to said pin diode fourth means, for supplying logic one direct current signals to said fourth means to allow the passage of signals between said second and third means, logic zero direct current signals applied to said fourth means resulting in blocking of signals between said second and third means.

4. Radio frequency signal switch matrix module apparatus comprising, in combination:
   radio frequency signal shielding base first means, including a maze of enclosed and interconnected compartments and signal ports, for selectively distributing signals between ports; and
   control signal feedthrough second means, mounted in said base means, for passing direct voltage control signals between a compartment of said base means and the outside environment without passing RF signals between the compartment of the base means and the environment;
   resistive signal splitting third means, located in one of the compartments of said base first means and connected to a first of said signal ports for bidirectionally transferring signals between ports;
   further circuit means fourth means, including series connected pin diode fifth means, connected between said signal splitting third means and a second of said signal ports, for providing minimum signal attenuation between said first and second ports when said fifth means is actuated;

attenuation sixth means, including series connected pin diode seventh means, connected in parallel with said fourth means, for providing control signal selectable attenuation;

control signal supplying eighth means for supplying direct voltage signals to selected pin diodes; and means connecting said eighth means through said second means to said pin diode means for selectively controlling the attenuation of signals applied to a given signal port as compared to that output at a given different signal port of said module apparatus.

5. Bidirectional multiport RF (radio frequency) signal switching and attenuation apparatus comprising, in combination:

base means comprising a plurality of enclosed chambers interconnected by smaller cross section enclosed conduits, the size and location of said conduits relative the enclosed chambers minimizing RF coupling of RF signals between chambers, the base means further constituting a ground reference potential;

a plurality of RF signal ports on exterior surfaces of said base means for the application or receipt of RF signals;

signal dividing means located in one of said chambers, electrically insulated from said base means and connected to one of said plurality of RF signal ports;

signal attenuation means, electrically insulated from said base means and including a signal path of greater than one-half wavelength, located in at least one other of said enclosed chambers and electrically connected via said enclosed conduits between said signal dividing means and at least one of the remaining of said plurality of RF signal ports;

isolation diode means, located at one-quarter wavelength intervals along the signal path of said signal attenuation means and electrically connected between said signal path and said base means;

pin diode signal switching means, located in series with the signal path of said signal attenuation means, for preventing passage of RF signals in the signal path when said pin diode signal switching means is not in an activated condition; and control signal feedthrough means, including signal transmission means electrically connected to said pin diode means, mounted in said base means in the location of chambers containing signal attenuation means, for passing control signals to activate said pin diode signal switching means while preventing the emission of RF signals from said chamber on the signal transmission means.

6. Apparatus as claimed in claim 5 wherein said isolation diode means comprises pin diode means and said base means comprises, in addition:

control signal feedthrough means, including signal transmission means electrically connected to said isolation pin diode means, mounted in said base means in the location of chambers containing signal attenuation means, for passing control signals to activate said isolation pin diode means when said pin diode signal switching means are electrically inactive while preventing the emission of RF signals from said chamber on the signal transmission means.

7. Apparatus as claimed in claim 5 comprising, in addition:

further bidirectional signal attenuation means, each electrically insulated from said base means and each including a signal path of greater than one-half wavelength, located in others of said enclosed chambers and electrically connected via said enclosed conduits between said signal dividing means and others of the remaining ones of said plurality of RF signal ports;

further isolation diode means, located at one-quarter wavelength intervals along the signal path of each of said further signal attenuation means and electrically connected between said signal path and said base means; and further pin diode signal switching means, located in series with the signal path of each of said further signal attenuation means, for preventing passage of RF signals in the signal path when said pin diode signal switching means is not in an activated condition.

* * * * *